United States Patent
Tang et al.

(10) Patent No.: US 9,607,692 B2
(45) Date of Patent: Mar. 28, 2017

(54) THRESHOLD VOLTAGE DISTRIBUTION DETERMINATION

(71) Applicant: Micron Technology, Inc., Boise, ID (US)

(72) Inventors: Qiang Tang, Cupertino, CA (US); Feng Pan, Fremont, CA (US); Ramin Ghodsi, San Jose, CA (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/868,604

(22) Filed: Sep. 29, 2015

(65) Prior Publication Data

US 2016/0099048 A1 Apr. 7, 2016

Related U.S. Application Data

(60) Provisional application No. 62/059,261, filed on Oct. 3, 2014.

(51) Int. Cl.

| | |
|---|---|
| *G11C 11/34* | (2006.01) |
| *G11C 16/06* | (2006.01) |
| *G11C 11/56* | (2006.01) |
| *G11C 7/14* | (2006.01) |
| *G11C 29/02* | (2006.01) |
| *G11C 29/04* | (2006.01) |

(52) U.S. Cl.
CPC ............ *G11C 11/5642* (2013.01); *G11C 7/14* (2013.01); *G11C 29/021* (2013.01); *G11C 29/028* (2013.01); *G11C 2029/0409* (2013.01)

(58) Field of Classification Search
None
See application file for complete search history.

(56) References Cited

U.S. PATENT DOCUMENTS

| | | | |
|---|---|---|---|
| 7,675,772 B2 | 3/2010 | Goda et al. | |
| 7,871,467 B2 | 1/2011 | Sano et al. | |
| 8,077,515 B2 | 12/2011 | Shen et al. | |
| 8,159,874 B2 | 4/2012 | Roohparvar | |
| 8,358,542 B2 | 1/2013 | Radke et al. | |
| 8,451,664 B2 | 5/2013 | Radke et al. | |
| 9,159,435 B2 * | 10/2015 | Yang ................. | G11C 16/26 |

(Continued)

*Primary Examiner* — Harry W Byrne
*Assistant Examiner* — Sultana Begum
(74) *Attorney, Agent, or Firm* — Brooks, Cameron & Huebsch, PLLC

(57) ABSTRACT

Apparatuses and methods for threshold voltage (Vt) distribution determination are described. A number of apparatuses can include sense circuitry configured to determine a first current on a source line of an array of memory cells, the first current corresponding to a first quantity of memory cells of a group of memory cells that conducts in response to a first sensing voltage applied to an access line and determine a second current on the source line, the second current corresponding to a second quantity of memory cells of the group that conducts in response to a second sensing voltage applied to the access line. The number of apparatuses can include a controller configured to determine at least a portion of a Vt distribution corresponding to the group of memory cells based, at least in part, on the first current and the second current.

17 Claims, 3 Drawing Sheets

(56) References Cited

U.S. PATENT DOCUMENTS

| | | | |
|---|---|---|---|
| 2009/0003077 A1* | 1/2009 | Lim | G11C 16/3454 365/185.21 |
| 2010/0109735 A1* | 5/2010 | Lee | G11C 7/08 327/288 |
| 2010/0124127 A1* | 5/2010 | Sarin | G11C 11/5635 365/185.33 |
| 2010/0142274 A1* | 6/2010 | Goda | G11C 11/5628 365/185.03 |
| 2012/0127802 A1* | 5/2012 | Choi | G11C 16/3459 365/185.22 |
| 2012/0240011 A1 | 9/2012 | Helm et al. | |
| 2012/0262991 A1 | 10/2012 | Ghilardelli | |
| 2013/0163346 A1 | 6/2013 | Shen | |
| 2013/0166972 A1 | 6/2013 | Seabury et al. | |

\* cited by examiner

THRESHOLD VOLTAGE DISTRIBUTION DETERMINATION

PRIORITY INFORMATION

This application is a Non-Provisional of U.S. Provisional Application No. 62/059,261, filed Oct. 3, 2014, the contents of which are incorporated herein by reference.

TECHNICAL FIELD

The present disclosure relates generally to semiconductor memory devices and methods and, more particularly, to apparatuses and methods for threshold voltage (Vt) distribution determination.

BACKGROUND

Memory devices are typically provided as internal, semiconductor, integrated circuits, and/or external removable devices in computers or other electronic devices. There are many different types of memory, including random-access memory (RAM), read only memory (ROM), dynamic random access memory (DRAM), synchronous dynamic random access memory (SDRAM), phase change random access memory (PCRAM), and/or flash memory, among others.

Flash memory devices can be utilized as non-volatile memory for a wide range of electronic applications. Flash memory devices typically use a one-transistor memory cell that allows for high memory densities, high reliability, and/or low power consumption. Uses for flash memory include memory for solid state drives (SSDs), personal computers, personal digital assistants (PDAs), digital cameras, cellular telephones, portable music players (e.g., MP3 players), and/or movie players, among other electronic devices.

Two types of flash memory array architectures are "NAND" and "NOR" architectures, so called for the logical form in which the basic memory cell configuration of each is arranged. A NAND array architecture arranges its array of memory cells in a matrix such that the control gates of each memory cell in a "row" of the array are coupled to, and in some cases from, an access line, which is commonly referred to in the art as a "word line". However each memory cell is not directly coupled to a sense line (which is commonly referred to as a "data line" or a "bit line" in the art) by its drain. Instead, the memory cells of the array are coupled together in series, source to drain, between a common source and a sense line, where the memory cells commonly coupled to a particular sense line are commonly referred to as a "column" or a "string" in the art.

Memory cells in a NAND array architecture can be programmed to a target (e.g., desired, intended) program state. For example, electric charge can be placed on or removed from a charge storage structure (e.g., a floating gate or charge trap) of a memory cell to put the memory cell into one of a number of program states. For example, a single level cell (SLC) can be programmed to one of two program states (e.g., one bit) so as to represent a binary data value (e.g., "0" or "1") stored by the memory cell.

Some NAND memory cells can be programmed to one of more than two target program states. Such memory cells may be referred to as multistate memory cells, multiunit cells, or multilevel cells (MLCs). MLCs can provide higher density memories without increasing the number of memory cells because each memory cell can represent more than one bit. A MLC using four program states (e.g., 11, 01, 00, and 10) can use four charge amounts in a floating gate so that the state can be represented by one of four voltage levels such that the MLC can store two bits of data. Generally, N bits per memory cell can be represented using $2^N$ voltage levels. Newer devices may be expected to use eight or more voltage levels. Using a high number of bits per memory cell allows the production of flash devices with high data density and thus reduces the overall cost per flash device. The read operation of a SLC uses one Vt level that is between the "1" and "0" voltage levels (e.g., program states). However, the read operation of a MLC with four states uses three Vt levels, an MLC with eight states uses seven Vt levels, and a memory cell that stores N bits per memory cell, represented by $2^N$ states, uses $2^{N-1}$ Vt levels for read operations.

A NAND array architecture that includes a large number of memory cells with multiple bits per memory cell can be expected to have a range of actual Vt levels for each program state based upon statistical variation. The range of actual Vt levels for each program state may result from random variation in manufacturing and/or programming of the memory cells, in erasing a memory cell prior to being reprogrammed, which can inherently broaden a voltage level range stored by each memory cell for each program state, among other causes. With continued increase in complexity, miniaturization, etc., of NAND technology, along with the number of bits programmed per memory cell, the reliability and/or endurance of NAND memory cells may be decreasing, at least partially by variability in the actual threshold voltages for the program states relative to predetermined reference (e.g., sense and/or read) voltages.

DETAILED DESCRIPTION

Figure 1:
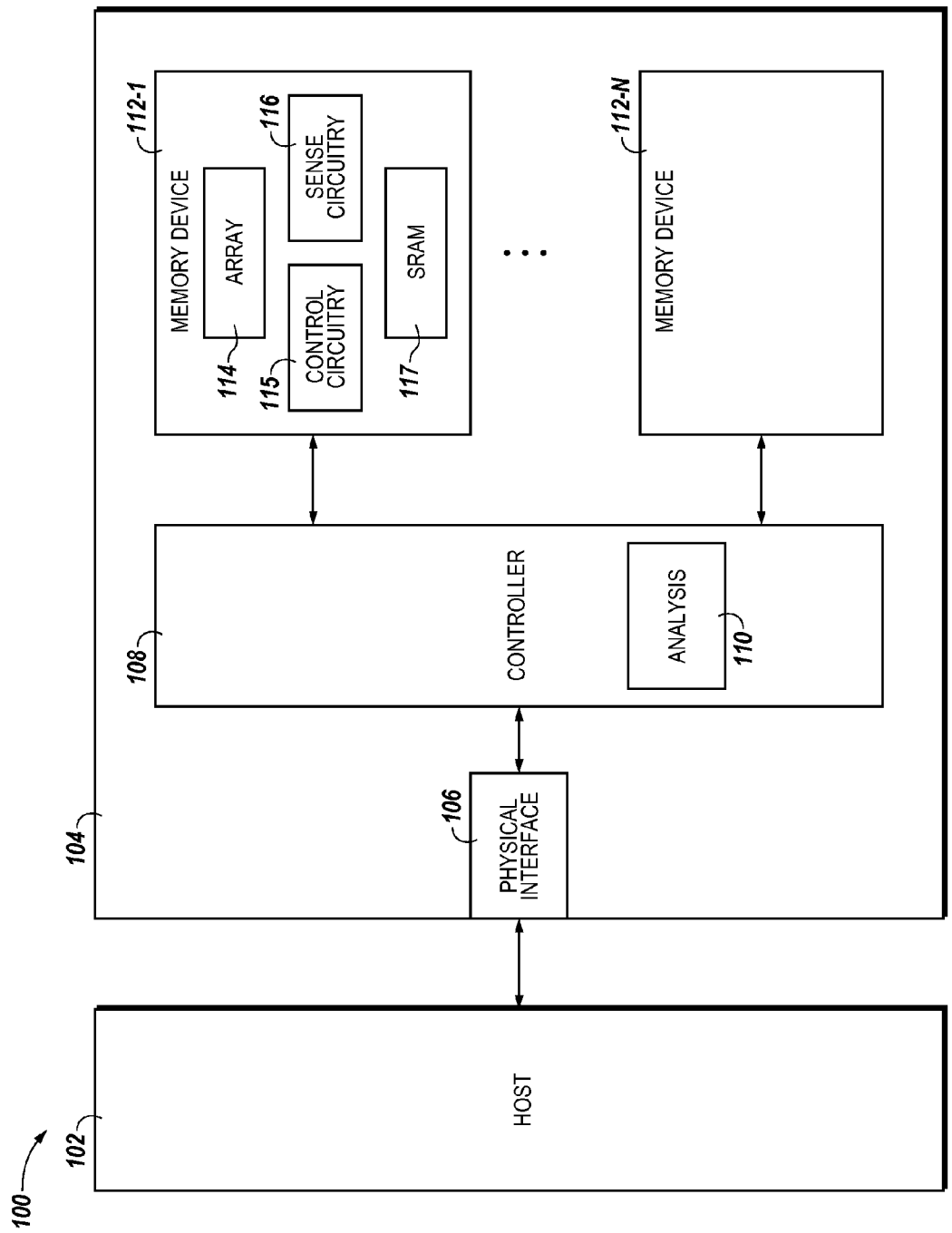
FIG. 1 is a block diagram of an apparatus in the form of a computing system including at least one memory system in accordance with a number of embodiments of the present disclosure.

The present disclosure includes apparatuses and methods for Vt distribution determination (e.g., collection, extraction, etc.). A number of embodiments of the present disclosure can provide benefits such as determining (e.g., extracting) Vt distributions corresponding to groups of programmed memory cells in a manner that can be faster and/or consume less power as compared to previous Vt distribution extraction methods. The Vt distribution information can be used for various purposes such as for calibration purposes (e.g., channel calibration, in-die self-calibration, etc.) associated with adjusting sensing voltages and/or read reference voltages for use in hard and/or soft data reads, for instance. The Vt distribution information can also be used in association with performing error detection and/or correction (e.g., error correcting code (ECC) processes, which may include low density parity check (LDPC) processes, for instance).

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Similar elements or components between different figures may be identified by the use of similar digits. For example, 111 may reference element "11" in FIG. 1, and a similar element may be referenced as 211 in FIG. 2. As will be appreciated, elements shown in the various embodiments herein can be added, exchanged, and/ or eliminated so as to provide a number of additional embodiments of the present disclosure. In addition, as will be appreciated, the proportion and/or the relative scale of the elements provided in the figures are intended to illustrate the embodiments of the present invention and should not be taken in a limiting sense.

As used herein, the designators "N" and "M," particularly with respect to reference numerals in the drawings, indicate that a number of the particular feature so designated can be included with a number of embodiments of the present disclosure. Additionally, as used herein, "a number of" something can refer to one or more such things. For example, a number of memory devices can refer to one or more memory devices.

FIG. 1 is a block diagram of an apparatus in the form of a computing system 100 including at least one memory system 104 in accordance with a number of embodiments of the present disclosure. Memory system 104 can be, for example, a solid state drive (SSD). In the embodiment illustrated in FIG. 1, memory system 104 includes a physical host interface 106, a number of memory devices 112-1, . . . , 112-N (e.g., solid state memory devices), and a controller 108 (e.g., an SSD controller) coupled to the physical host interface 106 and the memory devices 112-1, . . . , 112-N.

Physical host interface 106 can be used to communicate information between memory system 104 and another device, such as a host 102. Host 102 can include a memory access device (e.g., a processor). One of ordinary skill in the art will appreciate that "a processor" can be a number of processors, such as a parallel processing system, a number of coprocessors, etc. Example hosts can include laptop computers, personal computers, digital cameras, digital recording and playback devices, mobile telephones, PDAs, memory card readers, interface hubs, and the like.

Physical host interface 106 can be in the form of a standardized physical interface. For example, when memory system 104 is used for information storage in computing system 100, physical host interface 106 can be a serial advanced technology attachment (SATA) physical interface, a peripheral component interconnect express (PCIe) physical interface, or a universal serial bus (USB) physical interface, among other physical connectors and/or interfaces. In general, physical host interface 106 can provide an interface for passing control, address, information (e.g., data), and/or other signals between memory system 104 and a host (e.g., host 102) having compatible receptors for physical host interface 106.

Controller 108 can include, for example, hardware (e.g., circuitry), software, and/or firmware. Controller 108 can be operably coupled to or included on the same physical device (e.g., a die) as a number of the memory devices 112-1, . . . , 112-N. For example, controller 108 can be an application specific integrated circuit (ASIC) operably coupled to a printed circuit board including physical host interface 106 and memory devices 112-1, . . . , 112-N. Alternatively, controller 108 can be included on a separate physical device that is coupled to the physical device (e.g., the die) that includes a number of the memory devices 112-1, . . . , 112-N.

Controller 108 can communicate with memory devices 112-1, . . . , 112-N to direct operations to sense (e.g., read), program (e.g., write), and/or erase information, among other operations. Controller 108 can have circuitry that may be a number of integrated circuits and/or discrete components. In a number of embodiments, the circuitry in controller 108 may include circuitry for controlling access across memory devices 112-1, . . . , 112-N and/or circuitry for providing a translation layer between host 102 and memory system 104. The controller 108 can include analysis 110 circuitry and/or programming for analysis and/or implementation of, for instance, the collection, determination, correction, etc., of Vt distributions and/or reference voltages for memory cells, and/or to determine a program state of memory cells, as described herein. In a number of embodiments, such analysis can be performed as a result of input through the host 102 provided by a manufacturer- and/or seller-associated tester and/or an in-service tester (e.g., provided by an automated testing program and/or by a human operator, among other possibilities).

Memory devices 112-1, . . . , 112-N can include, for example, a number of non-volatile memory arrays 114 (e.g., arrays of non-volatile memory cells). For instance, memory devices 112-1, . . . , 112-N can include arrays of memory cells, such as array 220 described in FIG. 2, which can be operated in accordance with embodiments described herein. As will be appreciated, the memory cells in the memory arrays 114 of memory devices 112-1, . . . , 112-N can be in a NAND architecture, a NOR architecture, or some other memory array architecture.

A number of memory devices 112-1, . . . , 112-N can be formed on a same die, and a particular memory device (e.g., memory device 112-1) can include a number of arrays 114. As shown in FIG. 1, a memory device (e.g., 112-1) can include control circuitry 115, sense circuitry 116, and memory 117 (e.g., storage in addition to that provided by array 114).

The control circuitry 115 can, in various embodiments, be configured (e.g., with ASICs, software, firmware, and/or memory, etc.) to include and/or control components (e.g., drivers, buffers, etc.) that apply particular voltages to components (e.g., access lines, sense lines, and/or source lines) associated with memory cells of a memory device. The sense circuitry 116 can, in various embodiments, be configured (e.g., with ASICs, software, firmware, and/or memory, etc.) to include and/or control components that sense (e.g., measure) source current and/or identify (e.g., store information to identify) particular memory cells determined to have conducted and particular memory cells not determined to have conducted in response to an applied sensing voltage, as described herein. In various embodiments, control components that sense the source current can include number of buffers, a source regulator, and/or an analog to digital converter (ADC), as described herein.

The memory 117 can include static random access memory (SRAM) and/or dynamic RAM (DRAM), which can be used, for example, to store source current and/or Vt distribution information, as described further herein. The memory arrays 114 of memory devices 112-1, . . . , 112-N can include a number of memory cells that can be grouped.

As used herein, a group can include a number of memory cells, such as those formed on or in a die, a number of entire arrays, a page, a block, a plane, and/or other groups of memory cells. For example, some memory arrays can include a number of pages of memory cells that make up a block of memory cells. A number of blocks can be included in a plane of memory cells. A number of planes of memory cells can be included on a die. As an example, a 128 gigabyte (GB) memory device can include 4320 bytes of information per page, 256 pages per block, 2048 blocks per plane, and 16 planes per memory device.

The embodiment illustrated in FIG. 1 can include additional circuitry that is not illustrated so as not to obscure embodiments of the present disclosure. For example, memory devices 112-1, . . . , 112-N can include address circuitry to latch address signals provided over I/O connectors through I/O circuitry. Address signals can be received and decoded by a row decoder and a column decoder to access memory array 114. It will be appreciated that the number of address input connectors can depend on the density and/or architecture of memory devices 112-1, . . . , 112-N and/or memory arrays 114.

Figure 2:
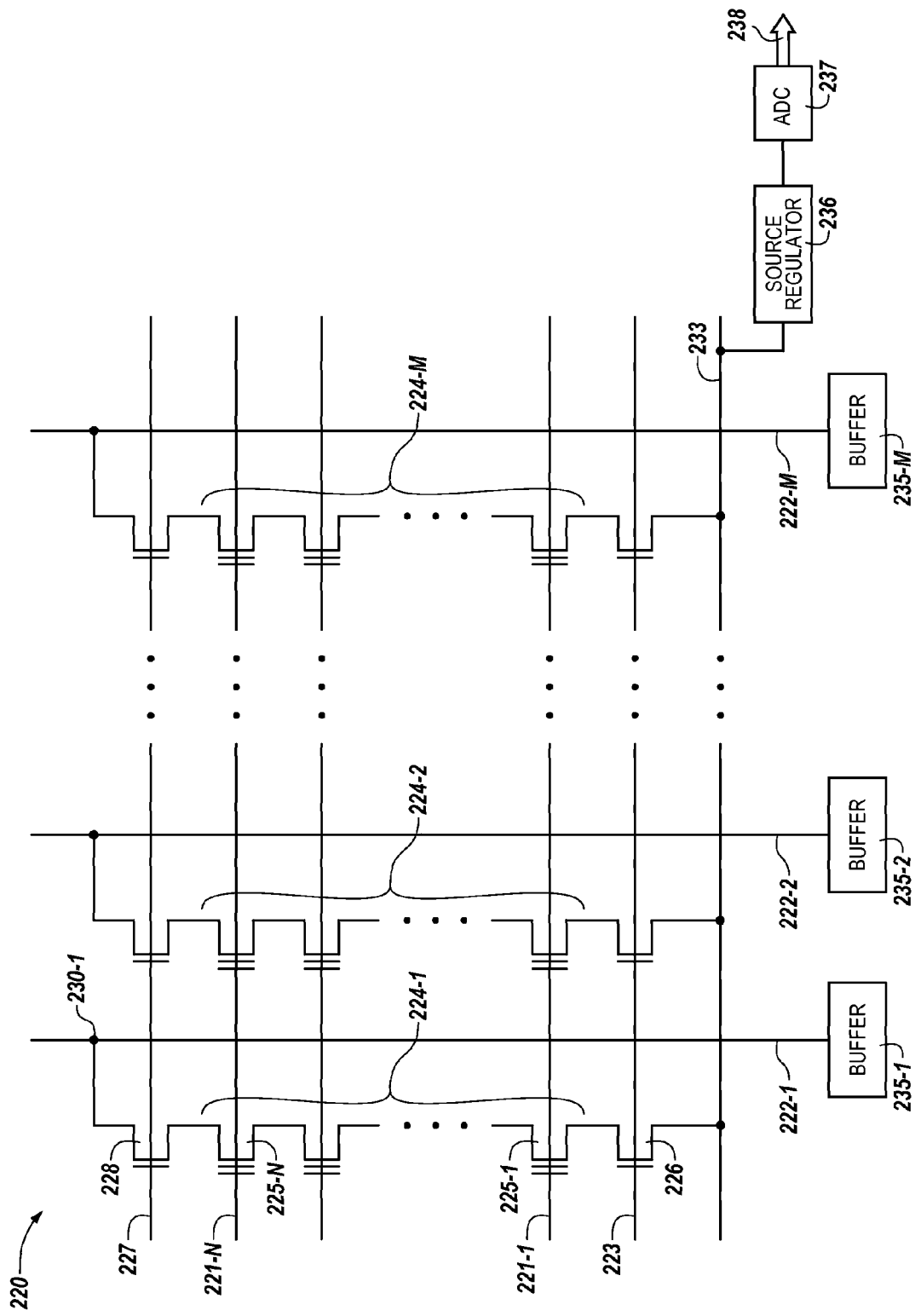
FIG. 2 is a schematic of a portion of an apparatus in the form of a memory array in accordance with a number of embodiments of the present disclosure.

FIG. 2 is a schematic of a portion of an apparatus in the form of a memory array 220 in accordance with a number of embodiments of the present disclosure. The embodiment of FIG. 2 illustrates a NAND architecture non-volatile memory array 220. However, embodiments described herein are not limited to this example. As shown in FIG. 2, the memory array 220 includes access lines 221-1, . . . , 221-N (which may be referred to herein as word lines 221-1, . . . , 221-N) and sense lines 222-1, . . . , 222-M (e.g., which may be referred to herein as bit lines 222-1, . . . , 222-M). For ease of addressing in the digital environment, the number of word lines 221-1, . . . , 221-N and the number of bit lines 222-1, . . . , 222-M can be some power of two (e.g., 256 word lines by 4,096 bit lines).

Memory array 220 includes NAND strings 224-1, . . . , 224-M. Each NAND string includes a number of memory cells 225-1, . . . , 225-N whose gates are coupled to respective access lines 221-1, . . . , 221-N). The memory cells 225-1, . . . , 225-N of each NAND string 224-1, . . . , 224-M are coupled to a respective sense line (222-1, . . . , 222-M). The memory cells 225-1, . . . , 225-N of each NAND string 224-1, . . . , 224-M are connected in series source to drain between a source select gate (SGS) 226 (e.g., a field-effect transistor (FET)) and a drain select gate (SGD) 228 (e.g., a FET). Each source select gate 226 is configured to selectively couple a respective NAND string to a common source line 233 responsive to a signal on source select line 223, while each drain select gate 228 is configured to selectively couple a respective NAND string 224-1, . . . , 224-M to a respective bit line 222-1, . . . , 222-M responsive to a signal on drain select line 227.

As shown in the embodiment illustrated in FIG. 2, a source terminal of source select gate 226 is connected to the common source line 233. The drain terminal of source select gate 226 is connected to the source terminal of the memory cell (e.g., 225-1) of the corresponding NAND string (e.g., 224-1). The drain terminal of drain select gate 228 is connected to the bit line (e.g., 222-1) of the corresponding NAND string (e.g., 224-1) at a drain contact (e.g., 230-1). The source terminal of drain select gate 228 is connected to the drain terminal of the last memory cell (e.g., 225-N) of the corresponding NAND string (e.g., 224-1).

In a number of embodiments, the memory cells 225-1, . . . , 225-N are non-volatile memory cells comprising a source, a drain, a floating gate or other charge storage structure, and a control gate. The memory cells 225-1, . . . , 225-N have their control gates coupled to a word line 221-1, . . . , 221-N, respectively. A NOR array architecture would be similarly laid out, except that the string of memory cells would be coupled in parallel between the select gates.

Groups (e.g., subsets) of memory cells coupled to a selected word line 221-1, . . . , 221-N can be programmed and/or sensed (e.g., read) together as a group. A group of memory cells programmed and/or sensed together can be referred to as a page of memory cells and can correspond to a number of pages of data. A programming operation (e.g., a write operation) can include applying a number of program pulses (e.g., 16-20 volts (V)) to a selected word line in order to increase the Vt of selected memory cells coupled to that selected word line to a target (e.g., desired) Vt level corresponding to a target program state.

A sensing operation, such as a read operation, can include sensing a voltage and/or current change (e.g., discharge) on a sense line (e.g., 222-1) coupled to a selected memory cell (e.g., 225-1) in order to determine whether the memory cell conducts. As an example, a sensing operation can include applying a particular sensing voltage to a selected access line (e.g., an access line to which a cell or group of cells is coupled) while biasing the sense line(s) at a particular voltage and while biasing the source line 233 at a different particular voltage (e.g., to provide a non-zero Vds (drain to source voltage) corresponding to the memory cell(s)). During a sensing operation, the source select line 223 and the drain select line 227 can be biased such that the SGD 228 and SGS 226 are conducting (e.g., turned on), and the non-selected word lines can be biased at a pass voltage such that the cells coupled thereto conduct regardless of their particular threshold voltages. During the sensing operation, the cell or group of cells being read may or may not conduct responsive to the applied sensing voltage (e.g., the voltage applied to the selected access line). Whether a particular cell conducts responsive to the applied sensing voltage depends on Vt level of the particular cell. As an example, in a number of embodiments, the sensing voltage level corresponds to Vt level of the memory cell(s) such that a memory cell will conduct if its Vt is below the sensing voltage level and will not conduct if its Vt is above the sensing voltage level. As described further herein, in a number of embodiments, a memory cell coupled to a selected access line can be prevented from conducting, for instance, by applying a same voltage to the sense line to which the memory cell is coupled as the voltage at which the source line is biased (e.g., such that Vds of the cell is 0).

In a number of embodiments, the cumulative (e.g., total and/or net, as described herein) cell current conducted by memory cells being sensed can be measured on the common source line 233. For example, a component such as source regulator 236 shown in FIG. 2 can be used to determine the current on the source line 233. The cumulative current is proportional to the quantity of memory cells that conduct during a particular sensing operation (e.g., responsive to a particular sensing voltage). As described further herein, a source current distribution and/or a Vt distribution corresponding to a group of memory cells can be determined by performing a number of successive sensing operations on the group of memory cells in accordance with a number of embodiments of the present disclosure. In a number of embodiments, analysis of the Vt distribution information can be performed and can be used in association with various processes such as calibration, error detection and/or correct, etc.

For example, the Vt distribution of the memory cells coupled to a selected access line can be determined by incrementally increasing access line voltages and measuring and/or recording increases of source current conducted by the common source line. In a number of embodiments, to determine the Vt distribution of a number of selected memory cells, the corresponding word line (e.g., access line 221-1) can have a range of sensing voltages applied so that the word line voltage is incrementally stepped. In a number of embodiments, the incremental steps can be small voltage difference increments, for instance, from a low voltage (e.g., 0 V) to a relatively high voltage (e.g., 6 V). For example, the range of 0-6 V can be covered in 120 steps that each increases by 50 millivolts (mV).

The current level on the common source line (e.g., common source line 233) is indicative of the quantity of memory cells that are conducting responsive to a sensing operation. By incrementally raising the sensing voltages applied to the access line, a Vt distribution can be determined (e.g., extracted) for the memory cells (e.g., page of memory cells) coupled to that access line.

In a number of embodiments, as described herein, such a determination of a Vt distribution can be performed on memory cells (e.g., in a NAND array) programmed as a result of ordinary use (e.g., customer use of a computing device) to provide an in-service snap-shot of the Vt distribution. In a number of embodiments, as described herein, such a determination of a Vt distribution can be performed (e.g., by a manufacturer- and/or seller-associated tester and/or an in-service tester) by preprogramming the memory cells to a target (e.g., desired, intended, etc.) distribution of program states and reading the preprogrammed memory cells using a number of particular reference voltages (e.g., read reference voltages), which may be predetermined. In a number of embodiments of the present disclosure, in particular for a selected MLC, it can be useful to compare the determined Vt distribution, as described herein, to the intended distribution of program states determined using the predetermined reference voltages. In a number of embodiments, as described herein, such Vt distribution analyses can be useful in adjusting the reference voltages to more accurately read intended program states for the memory cells (e.g., by being more appropriately located in valleys of the Vt distribution).

A number of buffers (e.g., buffers 235-1, . . . , 235-M) each can be coupled to respective sense lines 222-1, . . . , 222-M. In FIG. 2, the buffers 235-1, . . . , 235-M are coupled to respective sense lines 222-1, . . . , 222-M on a drain side (e.g., adjacent a drain contact 230-1) of the respective sense lines 222-1, . . . , 222-M. The buffers 235-1, . . . , 235-M can be used to apply a voltage as a bias to the respective bit lines 222-1, . . . , 222-M in association with determining Vt distributions in accordance with embodiments described herein.

In a number of embodiments, determining a Vt distribution can include biasing the bit lines 222-1, . . . , 222-M at 0.5 V, biasing the common source line 233 at 0 V, and biasing a well region (P-well) (not shown) associated with the NAND string 224-1 at 0 V. However, embodiments are not so limited. For example, the bit lines 222-1, . . . , 222-M can be biased at 1.0 V and the source line 233 can be biased at 0.5 V. It is noted that, as described below, cells can be prevented from contributing to the current on the source line by biasing the sense lines coupled to those cells at a same voltage at which the source line is biased (e.g., such that cells previously determined to conduct are "knocked out").

In such a sensing operation, the program state of the selected memory cell can be determined based on the source current output to the common source line corresponding to the string in response to a particular sensing voltage applied to the corresponding access line that matches or exceeds the Vt for the selected memory cell. For instance, the program state of the selected memory cell can be determined based on whether the source current changes by a particular amount and/or reaches a particular level in a given time period. Under such biasing conditions, source current levels on the common source line 233 in response to the particular applied sensing voltage (e.g., as applied to access line 221-1) can be sensed (e.g., measured) by sense circuitry and/or regulated by control circuitry.

The sense circuitry can be the sense circuitry 116 and the control circuitry can be the control circuitry 115 described with regard to FIG. 1, which, in some embodiments, can combined in a single functionality. For example, source regulator 236 shown in FIG. 2 can, in a number of embodiments, include and/or be coupled to circuitry configured to regulate (e.g., control) a source current level in the common source line 233 in response to conductive memory cells. In a number of embodiments, the source regulator 236 can include and/or be associated with an electrical power source (not shown) having sufficiently high voltage and/or amperage capacity to provide a sufficient current level (e.g., where the current can be in a range of from around 20 nanoamperes (nA) to around 1.0 ampere (A)) in the common source line 233 in response to the conductive memory cells. In a number of embodiments, the source regulator 236 can include and/or be coupled to circuitry (e.g., sense circuitry 116) configured to sense (e.g., measure) the source current level in the common source line 233.

In a number of embodiments, the source current level can be sensed (e.g., measured) as an analog value by the source regulator 236. Such analog values can be output by the source regulator 236 to an ADC 237 to convert the analog values to digital (e.g., binary) values used to represent particular source currents. In a number of embodiments, the digital values can be output 238 by the ADC 237 for further processing (e.g., analysis). For example, digital values (e.g., data) representing response to a range of sensing voltages applied to a page of memory cells coupled to a selected word line can be output 238 (e.g., to memory 117).

In a number of embodiments, such data can be output 238 from the ADC 237 on the same die as the array of memory cells (e.g., as shown at 114 in FIG. 1 and/or at 220 in FIG. 2). For example, such data can be output from memory 117 to a controller 108, as shown in FIG. 1, that is included on a separate physical device that is coupled to the physical device (e.g., the die) that includes a number of the memory devices 112-1, . . . , 112-N each having an array of memory cells. In a number of embodiments, the controller 108 can include analysis 110 circuitry and/or programming for analysis and/or implementation of firmware analytics can be included on the controller 108 and/or the host 102 for the further Vt distribution analysis and/or related analyses and/or functions (e.g., error correction, etc.). For example, such analysis can include determination of a distribution of particular program states (e.g., program states L0, L1, L2, and/or L3 as shown in FIG. 3) of a number of pages of memory cells and/or determination of a number of reference voltages (e.g., read reference voltages shown at 356, 357, 358, and/or 359 in FIG. 3) suitable for reads of the particular program states.

Figure 3:
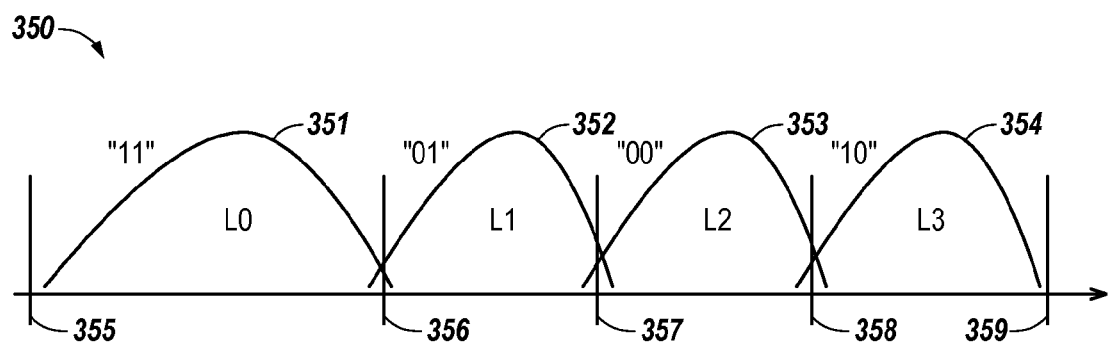
FIG. 3 is a diagram illustrating a number of Vt distributions corresponding to program states associated with programmed memory cells in accordance with a number of embodiments of the present disclosure.

FIG. 3 is a diagram 350 illustrating a number of Vt distributions corresponding to program states associated with programmed memory cells in accordance with a number of embodiments of the present disclosure. To determine (e.g., extract) the Vt distribution of a number of memory cells (e.g., coupled to a selected access line), the access line can be stepped incrementally from a lower (e.g., lowermost) sensing voltage to a higher (e.g., uppermost) sensing voltage, while sensing the source current (e.g., sensing the source current at every step). The point at which the source current output by the source increases (e.g., above a threshold current (e.g., amperage) level corresponding to an amount of current conducted by a single memory cell when transitioned to a conducting state) corresponds to a transition of at least one memory cell from, as shown in FIG. 3, a "1" to a "0" program state. As such, the particular sensing voltage applied to the access line at which the source current increases is proportional to the Vt of the at least one memory cell. In various embodiments, as described herein, a plurality of different sensing voltages can be successively (e.g., incrementally) applied to a particular selected access line.

The memory cells associated with FIG. 3 can be memory cells such as memory cells 225-1, ..., 225-N described herein with regard to FIG. 2. The memory cells associated with FIG. 3 are two-bit (e.g., four-state) MLCs. However, embodiments of the present disclosure are not limited to the examples just presented.

The Vt distributions 351, 352, 353, and 354 of FIG. 3 correspond to a group of memory cells each programmed to one of four program states (e.g., L0, L1, L2, and L3). In this example, the program states L0, L1, L2, and L3 represent logic values 11, 01, 00, and 10, respectively. In a number of embodiments, the logic values corresponding to program states can contribute to an upper and lower page of data. However, embodiments are not so limited.

A number of statistical processes can, as described herein or otherwise, be implemented for performing Vt distribution analysis in accordance with a number of embodiments of the present disclosure. A number of reference voltages, which can be predetermined, can be used to distinguish between a number of program states of a memory cell. Adjusting at least one of the reference voltages can be useful to reduce read errors of the program states based, for example, on the Vt distributions 351, 352, 353, and/or 354 shifting and/or widening such that the valleys 355, 356, 357, 358, and/or 359 also shift.

For example, a number of the memory cells may be sensed to be in a state other than the target state (e.g., a state different from the state to which the number of memory cells was intended to be programmed) when a predetermined reference voltage is applied thereto. As described herein, such errors can be detected and/or corrected by ECC schemes such as, for example, a LDPC scheme, which may utilize soft data associated with the data state of the memory cell to correct the error. Reduction of such errors, and correction thereof, can result from adjustment of a number of reference voltages based upon determination of a number of reference voltages more appropriate for sensing the number of program states of selected memory cells (e.g., based upon the location of the peaks and/or valleys of the Vt distribution). For example, an ECC engine (e.g., associated with the analysis 110 circuitry and/or programming) can use the Vt distribution information to tune the soft data reference voltages and can utilize internal ECC parameters to improve a reference voltage for a given read situation.

In some examples, the soft data can be obtained from application of a soft data strobe that includes a range of sensing voltages that overlap (e.g., are substantially centered around) a predetermined reference voltage so that the access line corresponding to the memory cell is stepped (e.g., in small voltage difference increments) from a voltage lower than the predetermined reference voltage to a voltage higher than the predetermined reference voltage.

In a number of embodiments, a total range of 0-6 V can be covered in 120 steps that each increases incrementally by 50 mV. Such ranges of sensing voltages can be applied to an appropriate access line through execution of instructions (e.g., by the control circuitry 115 and/or the sense circuitry 116 illustrated in FIG. 1) stored on the same die (e.g., the memory device 112-1 illustrated in FIG. 1) as the array (e.g., the array 114 illustrated in FIG. 1). Results of application of the range of sensing voltage on the source current can be stored in a number of SRAM on the die (e.g., the SRAM 117 illustrated in FIG. 1) for automated output of such results (e.g., analog and/or digital values for a selected page of memory cells, as described herein) when instructed to do so via the controller 108, for example. In a number of embodiments, a number of SRAM 117 can be associated with and/or integral to a number of the buffers 235-1, ..., 235-M, the source regulator 236, and/or the ADC 237 illustrated in FIG. 2.

Accordingly, apparatuses for determination of Vt distributions can be formed to include a number of embodiments of the following elements consistent with the computing system 100 illustrated in FIG. 1, the memory array 220 illustrated in FIG. 2, and/or the Vt and/or source current distribution 350 illustrated in FIG. 3.

As such, a number of embodiments of apparatuses for Vt distribution determination can, as described herein, include an electrical power source (not shown) configured to apply a voltage potential to a source line 233 coupled to a number of memory cells 225-1, ..., 225-N. The number of apparatuses can include control circuitry 115 configured to apply at least one sensing voltage (e.g., of a series of stored sensing voltages) to a selected access line (e.g., word line) 221-1, ..., 221-N coupled to the number of memory cells (e.g., applied subsequent to storage of the series of stored sensing voltages). The number of apparatuses can include sense circuitry 116 configured to measure at least a first source current conducted by the source line 233 indicative of current conducted by at least one of the number of memory cells 225-1, ..., 225-N responsive to application of the at least one sensing voltage, as described herein. A number of embodiments of the apparatuses can be configured as an array of memory cells 114, 220 including a group of memory cells 225-1, among others in the same row, coupled to an access line 221-1 and to a number of sense lines 222-1, ..., 222-M commonly coupled to a source line 233. As described herein, the group of memory cells can include NAND flash memory cells.

A number of embodiments can be configured to include sense circuitry 116 configured to determine a first current on the source line 233, the first current corresponding to a first quantity of memory cells of the group that conduct in response to a first sensing voltage applied to the access line 221-1. The sense circuitry 116 also can be configured to determine a second current on the source line 233, the second current corresponding to a second quantity of memory cells of the group that conduct in response to a second sensing voltage applied to the access line 221-1. In various embodiments, the apparatus can be configured to increase a particular first sensing voltage to a particular second sensing voltage (e.g., by incrementally increasing access line voltages, as described herein). A number of embodiments can be configured to include a controller 108 configured to determine at least a portion of a Vt distribution corresponding to the group of memory cells based, at least in part, on the first current and the second current.

A number of embodiments can include memory 117 to store a source current distribution (e.g., using analog and/or digital values) corresponding to, at least in part, the first current and the second current on the source line 233. The memory 117 can, in various embodiments, be formed on a same die as at least one of the array 114, 220, the access line 221-1, and the sense circuitry 116. As described herein, the memory 117 can be SRAM.

A number of embodiments of the apparatuses can include an ADC 237 configured to convert the first current on the source line 233 from a first analog value to a first digital value and convert the second current of the source line 233 from a second analog value to a second digital value, where the first digital value indicates the first quantity of memory cells and the second digital value indicates the second quantity of memory cells. The first and second digital values can, in various embodiments, be stored in memory (e.g., 117) formed on the same die as at least one of the array 114, 220, the access line 221-1, and the sense circuitry 116.

In various embodiments, the apparatuses can include a source regulator 236 (e.g., as a portion of and/or coupled to the sense circuitry 116) coupled to the source line 233 and configured to sense current thereon (e.g., as analog values). In various examples, the source regulator 236 can be configured to sense conduction of a number of memory cells coupled to a selected access line 221-1 responsive to application of each respective sensing voltage of the number of different successively applied sensing voltages by measurement of a source current. For example, the source regulator 236 can be coupled to the ADC 237 such that analog values can be output by the source regulator to the ADC to convert the analog values to digital (e.g., binary) values used to represent particular source currents.

In various embodiments, the controller 108 can be external to the die and can be configured to analyze the stored source current distribution as received from the memory 117 to, at least in part, determine the corresponding Vt distribution. For example, the controller 108 can be configured to retrieve the stored source current distribution from the memory 117 for analysis 110 after a range of stored sensing voltages is applied to a page of memory cells 225-1, among others in the same row, coupled to the access line 221-1. Alternatively or in addition, the memory 117 can be configured to send the stored source current distribution to the controller 108 for analysis 110 after a range of stored sensing voltages is applied to a page of memory cells 225-1, among others, coupled to the access line 221-1.

The sense circuitry 116 can, in various embodiments, be configured to, for each respective sensing voltage of the number of different successively applied sensing voltages, determine a current on the source line 233. The current on the source line 233 can be responsive to application of the respective sensing voltage to the access line 221-1, application of a first voltage (e.g., biasing at 0.5 V, although such voltages are presented by way of example for comparison and not by way of limitation) to the source line 233 and to those sense lines 222-1, . . . , 222-M coupled to memory cells of the group determined to have conducted responsive to a prior application, to the access line 221-1, of at least one of the number of different sensing voltages and application of a second voltage (e.g., biasing at 1.0 V, which is higher than 0.5 V in order to provide a non-zero Vds) to those sense lines 222-1, . . . , 222-M coupled to memory cells of the group not determined to have conducted responsive to a prior application, to the access line 221-1, of at least one of the number of different sensing voltages.

In various embodiments, the sense circuitry 116 can be configured to identify memory cells (e.g., store locations the memory cells) of the group determined to have conducted and memory cells of the group not determined to have conducted to enable determination between application of the first voltage and the second voltage as applied to the corresponding sense lines 222-1, . . . , 222-M.

A number of embodiments of the apparatuses can be configured to include control circuitry 115 configured to successively apply a number of different sensing voltages to the access line 221-1. The control circuitry 115 can, in various embodiments, be configured to include a number of buffers 235-1, . . . , 235-M to apply the first voltage (e.g., 0.5 V) and the second voltage (e.g., 1.0 V) to bias the sense lines 222-1, . . . , 222-M. In some embodiments, at least one of the buffers can be configured to apply the first voltage to bias the source line 233. The control circuitry 115 can, in various embodiments, be configured to include a first buffer to apply the first voltage (e.g., 0.5 V) and the second voltage (e.g., 1.0 V) to bias the sense lines 222-1, . . . , 222-M and a second buffer (e.g., a driver) to apply the first voltage (e.g., 0.5 V) to bias the source line 233. In a number of embodiments, the second buffer (e.g., the driver) can be further configured to apply the number of different sensing voltages to the access line 221-1. In various embodiments, the control circuitry 115 can be located on the same die as the array 114, 220. In various embodiments, the controller can be external to the die that includes the array 114, 220, the control circuitry 115, and/or the sense circuitry 116.

As described herein, apparatuses can be configured to determine a source current distribution based, at least in part, on the current on the source line 233 determined for each respective sensing voltage of the number of different successively applied sensing voltages. Moreover, the apparatuses can be configured to determine a Vt distribution based, at least in part, on the source current distribution.

As described herein, a voltage difference between each of the number of different sensing voltages can correspond to a respective different range of threshold voltages corresponding to the group of memory cells. Accordingly, in various embodiments, apparatuses can be configured to determine a Vt distribution corresponding to the group of memory cells based, at least in part, on the current on the source line 233 determined for each respective sensing voltage, representing the ranges of thresholds voltages, of the number of different successively applied sensing voltages.

In various embodiments, as described herein, the controller 108 can be configured to perform an analysis 110 on the Vt distribution and, based on the analysis, adjust at least one sensing voltage associated with determining a program state of cells of the array 114, 220. The controller 108 can, in various embodiments, be configured to perform an analysis 110 on the Vt distribution and, based on the analysis, perform an error detection and/or correction process (e.g., an LDPC process) on memory cells of the array.

A number of methods for Vt distribution determination can be performed and/or enabled by various apparatus embodiments just presented. That is, embodiments of the methods presented herein can be performed in a number of embodiments of the apparatuses in the form of the computing system 100 illustrated in FIG. 1 and/or the memory array 220 illustrated in FIG. 2.

As such, a method for Vt distribution determination can, in various embodiments, include applying (e.g., via control circuitry 115) a first sensing voltage to a selected access line 221-1 to which a group of memory cells 225-1, among others in the same row, is coupled and determining (e.g., via sense circuitry 116) a first current on the source line 233 to which the group of memory cells is commonly coupled, the first current corresponding to a first quantity of memory cells of the group that conduct in response to the applied first sensing voltage. The method can include applying (e.g., via control circuitry 115) a second sensing voltage to the selected access line 221-1 and determining (e.g., via sense circuitry 116) a second current on the source line 233, the second current corresponding to a second quantity of cells of the group that conduct in response to the applied second sensing voltage. The method can include determining at least a portion of a Vt distribution (e.g., via the memory 117 and/or the controller 108) corresponding to the group of memory cells based, at least in part, on the first current and the second current. In various embodiments, the first quantity of memory cells can be prevented from contributing to the determined second current by biasing (e.g., via at least one buffer 235) sense lines 222-1, . . . , 222-M to which the first quantity of memory cells are coupled at a same voltage (e.g., 0.5 V) as a voltage at which the source line 233 is biased when the second current is determined.

The method can, as described herein, include increasing a particular applied first sensing voltage to a particular applied second sensing voltage. For example, the first applied sensing voltage can be increased incrementally to a number of sensing voltages (e.g., stored sensing voltage values) to determine at least a portion of a source current distribution.

The method can, in various embodiments, include applying (e.g., via control circuitry 115) a third sensing voltage to the selected access line 221-1 and determining (e.g., via sense circuitry 116) a third current on the source line 233, the third current corresponding to a third quantity of cells of the group that conduct in response to the applied third sensing voltage. In some embodiments, a difference between the second sensing voltage and the first sensing voltage can correspond to a first target Vt range and a difference between the third sensing voltage and the second sensing voltage can correspond to a second target Vt range.

In various embodiments, as described herein, at least a portion of a Vt distribution corresponding to the group of memory cells can be determined (e.g., via the memory 117 and/or the controller 108) based, at least in part, on the first current, the second current, and the third current. In various embodiments, the first quantity of memory cells and the second quantity of memory cells can be prevented from contributing to the determined third current by biasing (e.g., via at least one buffer 235) sense lines 222-1, . . . , 222-M to which the first and second quantity of cells are coupled at the same voltage (e.g., 0.5 V) as the voltage at which the source line is biased when the third current is determined.

In various embodiments, at least the first current can include a contribution of a first background current. The first background current can be determined (e.g., via sense circuitry 116) by applying the first sensing voltage (e.g., via control circuitry 115) to the selected access line 221-1 while biasing (e.g., via at least one buffer 235), at a particular voltage (e.g., 0.5 V), those sense lines 222-1, . . . , 222-M coupled to memory cells determined (e.g., via sense circuitry 116) to conduct responsive to the first sensing voltage, and while biasing (e.g., via at least one buffer 235), at a different particular voltage (e.g., 1.0 V), those sense lines 222-1, . . . , 222-M coupled to memory cells not determined (e.g., via sense circuitry 116) to conduct responsive to the first sensing voltage. In this example, the particular voltage (e.g., 0.5 V) is a same voltage as that which the source line is biased while the first current is being determined.

The method can, in various embodiments, include converting, via an ADC 237, the first current and the second current from respective first and second analog values to respective first and second digital values. The first digital value can correspond to the first quantity of memory cells determined (e.g., via sense circuitry 116) to conduct responsive to the first sensing voltage and the second digital value can correspond to the second quantity of memory cells determined (e.g., via sense circuitry 116) to conduct responsive to the second sensing voltage. As such, a Vt of each memory cell of the second quantity of memory cells is within a particular range of voltages that is equal to a difference between the second sensing voltage and the first sensing voltage.

Accordingly, the method can, in various embodiments, include successively applying (e.g., via control circuitry 115) a number of different sensing voltages to a selected access line 221-1 of an array of memory cells 114, 220, where the selected access line 221-1 is coupled to a group of memory cells 225-1, among others in the same row, which are coupled to a number of sense lines 222-1, . . . , 222-M commonly coupled to a source line 233. For each respective sensing voltage of the number of different successively applied sensing voltages, the method can include determining (e.g., via sense circuitry 116) a current on the source line 233. The current on the source line 233 can be responsive to applying the respective sensing voltage to the access line 221-1, applying a first voltage (e.g., 0.5 V) to the source line 233 and to those sense lines coupled to memory cells of the group determined (e.g., via sense circuitry 116) to have conducted responsive to a prior application, to the access line 221-1, of at least one of the number of different sensing voltages and applying a second voltage (e.g., 1.0 V) to those sense lines coupled to memory cells of the group not determined (e.g., via sense circuitry 116) to have conducted responsive to a prior application, to the access line 221-1, of at least one of the number of different sensing voltages.

As such, a first source current corresponding to the first applied sensing voltage and a second source current corresponding to the second applied sensing voltage can be determined. In various embodiments, the method can include determining (e.g., via sense circuitry 116) an amount of current conducted by a memory cell (e.g., a single memory cell) responsive to (e.g., when conducting responsive to) the first applied sensing voltage. The method can include determining (e.g., via the controller 108) a difference between the first source current and the second source current. Determining the first source current can include determining (e.g., via sense circuitry 116) a total current conducted by memory cells (e.g., all memory cells) in the group of memory cells that conduct responsive to the first applied sensing voltage, as also can be done for a total second source current. As such, the method can include estimating (e.g., via the controller 108) a number of memory cells that conduct responsive to the first sensing voltage by dividing the difference between the total first source current and the total second source current by the amount of current conducted by the memory cell.

For instance, if conduction of a single memory cell produces a particular amount of current on the source line, and five times the particular amount of current is measured on the source line, then the quantity of memory cells determined to be conducting can be five. The number of memory cells transitioned to conducting responsive to the sensing voltage can be determined, in a number of embodiments, by dividing a total increase in the source current determined by sensing the common source line by the amount of current conducted by the single memory cell when transitioned to conducting responsive to the sensing voltage.

A source current distribution can be determined based, at least in part, on the current on the source line 233 determined (e.g., via sense circuitry 116) for each respective sensing voltage of the number of different successively applied sensing voltages. As described herein, a Vt distribution can be determined based, at least in part, on the source current distribution.

In various embodiments, the method can include performing a first sensing operation that includes applying a first sensing voltage (e.g., via control circuitry 115) to a selected access line 221-1 to which a group of memory cells 225-1, among others in the same row, is coupled while biasing (e.g., via at least one buffer 235) sense lines 222-1, . . . , 222-M to which the memory cells are coupled at a particular voltage (e.g., 1.0 V) and while biasing (e.g., via at least one buffer 235) a source line 233 to which the memory cells are commonly coupled at a different voltage (e.g., 0.5 V). As such, a first current on the source line 233 resulting from the first sensing operation can be determined (e.g., via sense circuitry 116), the first current being proportional to a first quantity of the memory cells determined to conduct responsive to the first sensing operation.

The method can include performing a second sensing operation that includes applying a second sensing voltage (e.g., via control circuitry 115) to the selected access line 221-1 while biasing (e.g., via at least one buffer 235), at the different voltage (e.g., 0.5 V), those sense lines coupled to memory cells previously determined (e.g., via sense circuitry 116) to conduct and while biasing, at the particular voltage (e.g., 1.0 V), those sense lines coupled to memory cells not previously determined (e.g., via sense circuitry 116) to conduct. As such, a second current on the source line 233 resulting from the second sensing operation can be determined, the second current being proportional to a second quantity of the memory cells determined to conduct responsive to the second sensing operation. Accordingly, as described herein, at least a portion of a Vt distribution corresponding to the group of memory cells can be determined (e.g., via the memory 117 and/or the controller 108) based, at least in part, on the first current and the second current.

The method can further include performing a third sensing operation that includes applying a third sensing voltage to the selected access line 221-1 while biasing (e.g., via at least one buffer 235), at the different voltage (e.g., 0.5 V), those sense lines coupled to memory cells previously determined to conduct and while biasing (e.g., via at least one buffer 235), at the particular voltage (e.g., 1.0 V), those sense lines coupled to memory cells not previously determined to conduct. As such, a third current on the source line resulting from the third sensing operation can be determined, the third current being proportional to a third quantity of the memory cells determined to conduct responsive to the third sensing operation. Accordingly, determination of the at least a portion of the Vt distribution corresponding to the group of memory cells can based, at least in part, on the first current, the second current, and the third current.

In various embodiments, the method can include performing (e.g., via the controller 108) a first background current operation. Determination of the first background current can be performed by applying (e.g., via control circuitry 115) the first sensing voltage to the selected access line 221-1 while biasing (e.g., via at least one buffer 235), at the different voltage (e.g., 0.5 V), those sense lines coupled to memory cells determined (e.g., via sense circuitry 116) to conduct responsive to the first sensing operation, and while biasing (e.g., via at least one buffer 235), at the particular voltage (e.g., 1.0 V), those sense lines coupled to memory cells not determined (e.g., via sense circuitry 116) to conduct responsive to the first sensing operation, and determining (e.g., while applying the first sensing voltage) the first background current (e.g., via sense circuitry 116) on the source line 233 responsive to the first background current operation.

The first background current operation can include deducting (e.g., subtracting) the first background current from the first current (e.g., to determine a first net current) in association with determining the at least a portion of the Vt distribution. In some embodiments, the method can include determining that the first applied sensing voltage is proportional to a Vt for at least one of the memory cells based upon an increase in the source current relative to the first background current.

Various embodiments, as described herein, can include adjusting (e.g., via the controller 108) at least one sensing voltage associated with sensing the group of memory cells based, at least in part, on the determined Vt distribution. Various embodiments, as described herein, can include using the determined Vt distribution in association with performing (e.g., via the controller 108) an error detection and/or correction process. Various embodiments, as described herein, can include using the controller 108 to analyze 110 the determined Vt distribution and perform an error detection and/or correction process that utilizes soft data based, at least in part, on the analysis of the determined Vt distribution.

Some techniques for Vt distribution extraction (e.g., from a NAND flash memory device) may include applying a range of word line voltages. However, such techniques may have a number of limitations. For instance, after application of each word line voltage range, a whole page worth of data may be read by a controller and processed externally to determine a number of memory cells with a Vt within the range. This may involve spending too much time and/or power for outputting the data and/or for external data processing. Such techniques may involve, after application of each word line voltage range, using an internal counter to count the number of cells with a Vt within the range. This may involve spending too much time and/or power for the internal counting and/or may be limited to profiling around a Vt distribution valley for the memory cells due to inherent limitation of the counter, such as speed, memory, etc. For instance, to reduce a raw bit error rate (RBER), a SSD system may prefer reading at the distribution valley.

In contrast, the Vt distribution determination described herein can provide a number of advantages. For instance, such advantages can include faster operation and/or lower power consumption. The faster operation and/or lower power consumption can result from not processing page data externally (e.g., doing such processing internally on-die by the control circuitry 115, sense circuitry 116, and/or SRAM 117), measuring source current through the source regulator 236 and/or the ADC 237 to determine a Vt distribution, which can use less power and/or time compared with determining a Vt for each memory cell, and extracting a whole distribution quickly in chip (e.g., on the die) with coarse or fine scans and with a small amount of data storage, among other advantages.

The Vt distribution determination described herein can be implemented in a number of applications. Such implementations of quick Vt distribution data collection (e.g., for a NAND flash array) can include faster and/or lower power consumption during channel calibration, in-die array self-calibration and/or self-testing, and/or extracting an accurate Vt distribution peak to enable interpolation of valley location according to an expected distribution, among other implementations.

The present disclosure includes apparatuses and methods for Vt distribution determination. A number of apparatuses can include sense circuitry configured to determine a first current on a source line of an array of memory cells, the first current corresponding to a first quantity of memory cells of a group of memory cells that conducts in response to a first sensing voltage applied to an access line and determine a second current on the source line, the second current corresponding to a second quantity of memory cells of the group that conducts in response to a second sensing voltage applied to the access line. The number of apparatuses can include a controller configured to determine at least a portion of a threshold voltage distribution corresponding to the group of memory cells based, at least in part, on the first current and the second current.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of the number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells comprising a group of memory cells coupled to an access line and to a number of sense lines commonly coupled to a common source line;
    a source regulator, including sense circuitry, directly coupled to the common source line and configured to:
        determine a first source current on the common source line, the first source current corresponding to a first quantity of memory cells of the group that conduct in response to a first sensing voltage applied to the access line;
        determine a second source current on the common source line, the second source current corresponding to a second quantity of memory cells of the group that conduct in response to a second sensing voltage applied to the access line, wherein a magnitude of the second sensing voltage is independent of the first source current; and
    a controller configured to determine at least a portion of a threshold voltage distribution corresponding to the group of memory cells based, at least in part, on the first source current and the second source current.

2. The apparatus of claim 1, wherein a magnitude of the first sensing voltage is greater than the magnitude of the second sensing voltage.

3. The apparatus of claim 1, wherein the apparatus includes an analog to digital converter configured to:
    convert the first source current on the common source line from a first analog value to a first digital value; and
    convert the second source current of the common source line from a second analog value to a second digital value;
    wherein the first digital value indicates the first quantity of memory cells and the second digital value indicates the second quantity of memory cells.

4. The apparatus of claim 3, wherein the first and second digital values are stored in memory formed on a same die as at least one of the array, the access line, and the sense circuitry.

5. The apparatus of claim 1, wherein the controller is further configured to retrieve a stored source current distribution from the memory for analysis after a range of stored sensing voltages is applied to a page of memory cells coupled to the access line.

6. The apparatus of claim 5, wherein the memory is configured to send the stored source current distribution to the controller for analysis after the range of stored sensing voltages are applied to the page of memory cells coupled to the access line.

7. An apparatus, comprising:
    an array of memory cells comprising a group of memory cells coupled to an access line and to a number of sense lines commonly coupled to a common source line;
    control circuitry configured to successively apply a number of different sensing voltages to the access line, wherein magnitudes of the number different sensing voltages successively applied to the access line are independent of determined currents on the common source line; and
    a source regulator, including sense circuitry, directly coupled to the common source line and configured to, for each respective sensing voltage of the number of different successively applied sensing voltages, determine a source current on the common source line responsive to:
        application of the respective sensing voltage to the access line;
        application of a first voltage to the common source line and to those sense lines coupled to memory cells of the group determined to have conducted responsive to a prior application, to the access line, of at least one of the number of different sensing voltages; and
        application of a second voltage to the common source line and to those sense lines coupled to memory cells of the group not determined to have conducted responsive to a prior application, to the access line, of at least one of the number of different sensing voltages.

8. The apparatus of claim 7, wherein the control circuitry is further configured to include a number of buffers to apply the first voltage and the second voltage to bias the sense lines.

9. The apparatus of claim 8, wherein at least one of the buffers is configured to apply the first voltage to bias the common source line.

10. The apparatus of claim 7, wherein the control circuitry is further configured to include a first buffer to apply the first voltage and the second voltage to bias the sense lines and a second buffer to apply the first voltage to bias the common source line.

11. The apparatus of claim 10, wherein the second buffer is further configured to apply the number of different sensing voltages to the access line.

12. The apparatus of claim 7, wherein the apparatus includes a controller external to a die comprising the array, the control circuitry, and the sense circuitry.

13. The apparatus of claim 7, wherein the source regulator directly coupled to the common source line is configured to measure conduction of a number of memory cells coupled to a selected access line responsive to application of each respective sensing voltage of the number of different successively applied sensing voltages by measurement of the source current.

14. The apparatus of claim 7, wherein the apparatus is configured to determine a source current distribution based, at least in part, on the source current on the common source line determined for each respective sensing voltage of the number of different successively applied sensing voltages.

15. The apparatus of claim 14, wherein the apparatus is configured to determine a threshold voltage distribution based, at least in part, on the source current distribution.

16. The apparatus of claim 7, wherein:
a voltage difference between each of the number of different sensing voltages corresponds to a respective different range of threshold voltages corresponding to the group of memory cells; and
the apparatus is configured to determine a threshold voltage distribution corresponding to the group of memory cells based, at least in part, on the source current on the common source line determined for each respective sensing voltage of the number of different successively applied sensing voltages.

17. A method, comprising:
determining, via a source regulator including sense circuitry and directly coupled to a common source line, a first source current on the common source line, wherein the first source current corresponds to a first quantity of memory cells of a group that conduct in response to a first sensing voltage applied to an access line to which the group is coupled, and wherein the group is coupled to a number of sense lines commonly coupled to the common source line;
determining, via the source regulator including sense circuitry, a second source current on the common source line, wherein the second source current corresponds to a second quantity of memory cells of the group that conduct in response to a second sensing voltage applied to the access line, and wherein a magnitude of the second sensing voltage is independent of the first source current; and
determining, via a controller, at least a portion of a threshold voltage distribution corresponding to the group of memory cells based, at least in part, on the first source current and the second source current.

* * * * *